United States Patent

Tani

[19]

[11] Patent Number: 5,821,994
[45] Date of Patent: Oct. 13, 1998

[54] IMAGE PICKUP AND DATA PROCESSING APPARATUS HAVING A PLURALITY OF SPECIAL-PURPOSE DETACHABLE SUBSTRATES

[75] Inventor: Nobuhiro Tani, Tokyo, Japan

[73] Assignee: Asahi Kogaku Kogyo Kabushiki Kaisha, Tokyo, Japan

[21] Appl. No.: 921,705

[22] Filed: Sep. 2, 1997

Related U.S. Application Data

[63] Continuation of Ser. No. 433,817, May 4, 1995, abandoned.

[30] Foreign Application Priority Data

May 6, 1994 [JP] Japan .................................. 6-117642

[51] Int. Cl.⁶ ............................. H04N 5/225; H04N 9/04
[52] U.S. Cl. .......................... 348/207; 348/222; 348/373
[58] Field of Search ............................... 348/65, 92, 207, 348/222, 72, 73, 74, 75, 230, 233, 373, 374, 375, 376, 552

[56] References Cited

U.S. PATENT DOCUMENTS

| | | | |
|---|---|---|---|
| 4,746,990 | 5/1988 | Katoh et al. ............................ | 358/310 |
| 4,896,211 | 1/1990 | Hunt et al. ............................... | 358/106 |
| 4,967,281 | 10/1990 | Takada ..................................... | 358/229 |
| 5,014,136 | 5/1991 | Sakai et al. .............................. | 358/341 |
| 5,016,107 | 5/1991 | Sasson et al. ........................... | 358/209 |
| 5,051,824 | 9/1991 | Nishigaki ................................. | 358/98 |
| 5,153,730 | 10/1992 | Nagasaki et al. ....................... | 358/209 |
| 5,378,881 | 1/1995 | Adachi .................................... | 235/462 |

*Primary Examiner*—Andrew I. Faile
*Assistant Examiner*—Christopher Onuaku
*Attorney, Agent, or Firm*—Greenblum & Bernstein, P.L.C.

[57] ABSTRACT

An image inputting apparatus which includes an image sensor which generates image signals, a first substrate having an A/D converter to process and convert the image signals to digital signals, and a second substrate which is electrically connected to the first substrate to process the digital signals. The second substrate is detachably mounted to a body of the apparatus. The first substrate is provided with an analog signal processing circuit to process the image signals supplied from the image sensor to obtain predetermined analog video signals. The second substrate may be provided with decoding circuitry to produce 1-bit image signals representing a white or black area of the image, or image signal processing circuitry to produce digital video signals.

31 Claims, 4 Drawing Sheets

IMAGE PICKUP AND DATA PROCESSING APPARATUS HAVING A PLURALITY OF SPECIAL-PURPOSE DETACHABLE SUBSTRATES

This application is a continuation of application Ser. No. 08/433,817, filed May 4, 1995, now abandoned.

BACKGROUND OF THE INVENTION

1. Field of the Invention

The present invention relates to an image processing apparatus for processing image signals corresponding to an image of a two-dimensional data symbol read by the image processing apparatus.

2. Description of the Related Art

In a known image inputting apparatus, electrical signals corresponding to an object image are generated by a CCD or a solid state image receiving device. Recently, a data symbol reader which reads a data symbol consisting of a two-dimensional monochrome mosaic pattern has been proposed. In such a known data symbol reader, the received image of the data symbol is converted to digital signals to be processed.

There is also known an industrial video apparatus having a CCD which is adapted, for example, to monitor factory production lines. The image received by the video apparatus is transmitted as an analog signal to a monitor.

As mentioned above, both the data symbol reader and the industrial video apparatus have signal processing circuits to process image signals obtained by the CCD. Furthermore, the data symbol reader and the industrial video apparatus are separately produced, thereby resulting in increased production costs and complicated manufacturing processes.

SUMMARY OF THE INVENTION

The primary object of the present invention is to provide an image inputting apparatus operable as a data symbol reader or an industrial video apparatus, etc., which can be easily and inexpensively produced as a single manufactured unit.

To achieve the object mentioned above, according to the present invention, there is provided an image processing apparatus for processing image signals supplied from an image receiving device, comprising, a video circuit which converts the image signals to video signals to output the image signals to a first eternal device; a signal processing circuit for processing the image signals to output the image signals to a second external device; and a support member for detachable mounting the signal processing circuit to the image receiving device or the video circuit.

According to another aspect of the present invention, there is provided an image inputting apparatus comprising an image sensor which generates image signals, a first substrate having an A/D converter to process and convert the image signals to digital signals, and a second substrate which is electrically connected to the first substrate to process the digital signals, the second substrate being detachable attached to a body of the apparatus, the first substrate being provided with an analog signal processing circuit to process the image signals supplied from the image sensor to obtain predetermined analog video signals.

The present disclosure relates to subject matter contained in Japanese Patent Application No. 06-117642 (filed on May 6, 1994) which is expressly incorporated herein by reference in its entirety.

BRIEF DESCRIPTION OF THE DRAWINGS

The invention will be described below with reference to the accompanying drawings, in which.

DESCRIPTION OF THE PREFERRED EMBODIMENT

Figure 1:
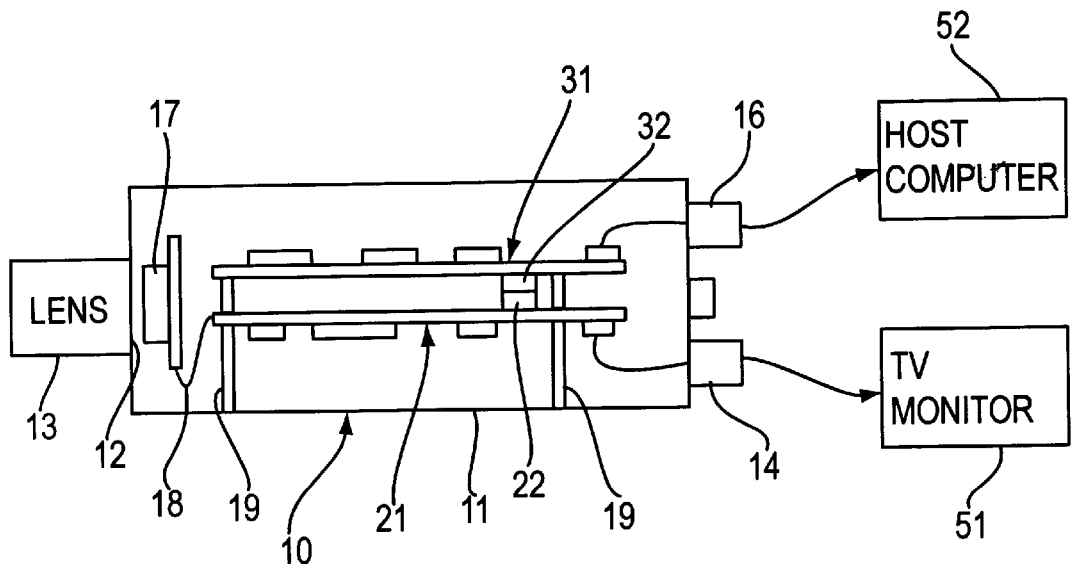
FIG. 1 is a schematic view of a data symbol reader to which a data inputting apparatus according to the present invention is applied.

FIG. 1 schematically shows an internal structure of a data inputting apparatus as applied to a stationary data symbol reader, according to a first embodiment of the present invention.

The body 10 of the apparatus includes a casing 11 in the form of a box, which is provided on the front end thereof with an opening 12 which is covered by a condenser lens 13, and on the rear end thereof with output terminals 14 and 16. Additionally, a CCD (image receiving sensor) 17, a flexible printed circuit board (PCB) 18, a first substrate (imaging substrate) 21, and a second substrate (decoding substrate) 31 are provided in the casing 11.

The CCD 17 is disposed behind the condenser lens 13, with the light receiving surface facing the opening 12. Light reflected from an object is converged by the condenser lens 13 to form an object image on the light receiving surface. The CCD 17 generates image signals corresponding to the object image input thereto. Namely, the CCD 17 is comprised of a large number of pixels having a matrix arrangement, where each picture element produces electric signal charge corresponding to the quantity of light gathered by the picture element. The accumulated signal charges are successively transmitted at a predetermined time. The signal charges constitute an image signal corresponding to the object image read by the CCD 17. The CCD 17 is electrically connected to the first substrate 21 through the PCB 18.

The first and second substrates 21 and 31 are detachably mounted to two upright supporting plates 19 which are provided on the bottom plate of the casing 11. Although the second substrate 31 is positioned above the first substrate 21 in FIG. 1, the arrangement can be reversed. The first substrate 21 and the second substrate 31 are provided, on the upper surface and the lower surface, with connectors 22 and 32, respectively. The connectors 22 and 32 can be electrically interconnected.

The first substrate 21 is connected to the output terminal 14 mounted to the casing 11. The output terminal 14 is connected to a TV monitor 51. The second substrate 31 is connected to the output terminal 16 mounted to the casing 16. The output terminal 16 is connected to a host computer 52.

Figure 2:
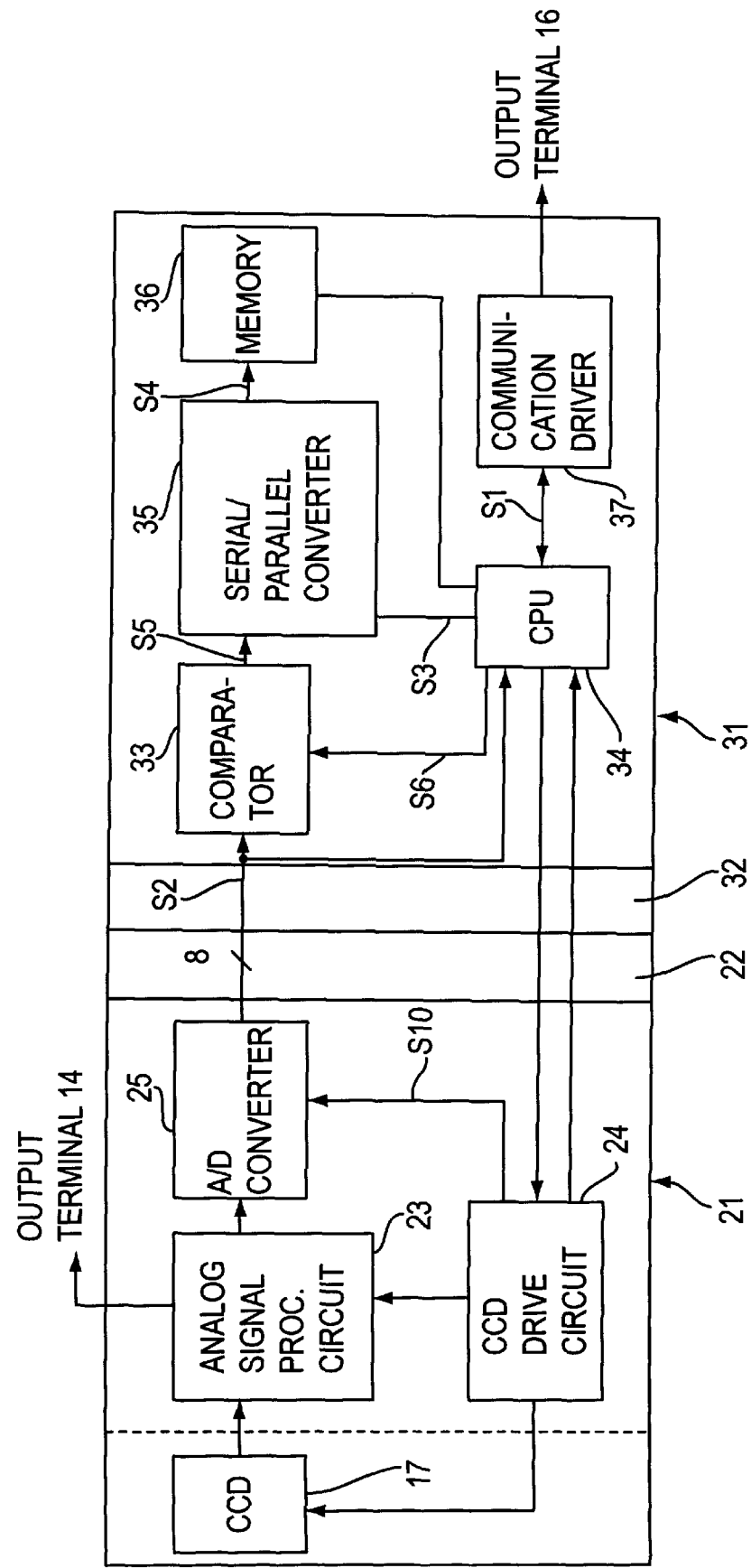
FIG. 2 is a block diagram of a data symbol reader shown in FIG. 1.

FIG. 2 shows a block diagram of the apparatus shown in FIG. 1. In FIG. 2, the first substrate 21 is provided with an analog signal processing circuit 23, a CCD drive circuit 24, an A/D converter 25 and leads or conductors interconnecting these components.

The CCD drive circuit 24 is connected to the CCD 17 through the PCB board 18 (see FIG. 1) to output, for example, shift pulses, drive pulses, and reset signals. The image signals produced by the CCD 17 are read-out in response to the shift pulses.

The analog signal processing circuit 23 is connected to the CCD 17 through the PCB 18, so that the image signals supplied from the CCD 17 are processed and converted to analog signals by the analog signal processing circuit 23. The analog signals are supplied to the A/D converter 25. The image signals are converted to analog or composite video signals in accordance with a standard TV system by the analog signal processing circuit 23 and are then supplied to the monitor 51 through the output terminal 14.

The A/D converter 25 is connected to the CCD drive circuit 24 by a control line S10, so that the analog signals supplied from the analog signal processing circuit 23 are converted to 8-bit digital signals in accordance with timing signal input through the control line S10.

The second substrate 31 is provided with a comparator 33, a CPU 34, a serial/parallel converter 35, a memory 36, a communication driver 37, and leads or conductors interconnecting these components. The second substrate 31 is provided on the upper surface thereof with a second connector 32 (see FIG. 1) which is electrically connected to the connector 22 of the first substrate 21 when the substrate 31 is mounted to the body 10.

The comparator 33 is connected to the A/D converter 25 through the 8-bit data signal line S2 provided within the connectors 22 and 32. The comparator 33 is connected to the serial/parallel converter 35 through 1-bit data signal lines S5. The CPU 34 is connected to the comparator 33 through an 8-bit bus S6. The serial/parallel converter 35 is connected to the CPU 34 through an 8-bit data signal line S3. The 8-bit data supplied from the A/D converter 25 is compared with a predetermined threshold value of 8-bit digital data supplied from the CPU 34 in the comparator 33, where it is judged whether the image signal represents a which or black area. Thereafter, 1-bit image signals are obtained which represent the result of the comparison in the comparator 33. The 1-bit image signals obtained are supplied to the serial/parallel converter 35.

The serial/parallel converter 35 is connected to the memory 36 through an 8-bit data signal line S4. Each unit consisting of eight 1-bit signals supplied from the serial/parallel converter 35 is written in, or read from, the memory 38 in accordance with the read/write timing signal supplied from a memory controller (not shown). This contributes to high-speed read/write operations of input/output data in the memory 36. The read signals are thereafter sent to the CPU 34.

The CPU 34 is connected to the CCD drive circuit 24, the communication driver 37, the serial/parallel converter 35, and the memory controller (not shown). The CPU 34 is connected to the CCD drive circuit 24 through the connectors 32 and 22, so that a command signal to read the image signals from the CCD 17 is supplied to the CCD drive circuit 24 from the CPU 34. The CPU 34 executes a data control instruction to the memory controller for a read/write operation in the memory 36. Moreover, the CPU 34 controls the data communication between the communication driver 37 and the host computer 52 connected to the body 10. The data outputted from the memory 36 is converted to serial data in accordance with an associated communication format and is then sent to the communication driver 37.

The communication driver 37 is connected to the CPU 34 through a serial data bus S1. The data supplied from the communication driver 37 is sent to the host computer 52 through the output terminal 16 and various processes are carried out in the host computer 52 in accordance with data input thereto. Also, the host computer 52 performs transmission and receipt of control command signals to or from the CPU 34 through the communication driver 37.

Figure 3:
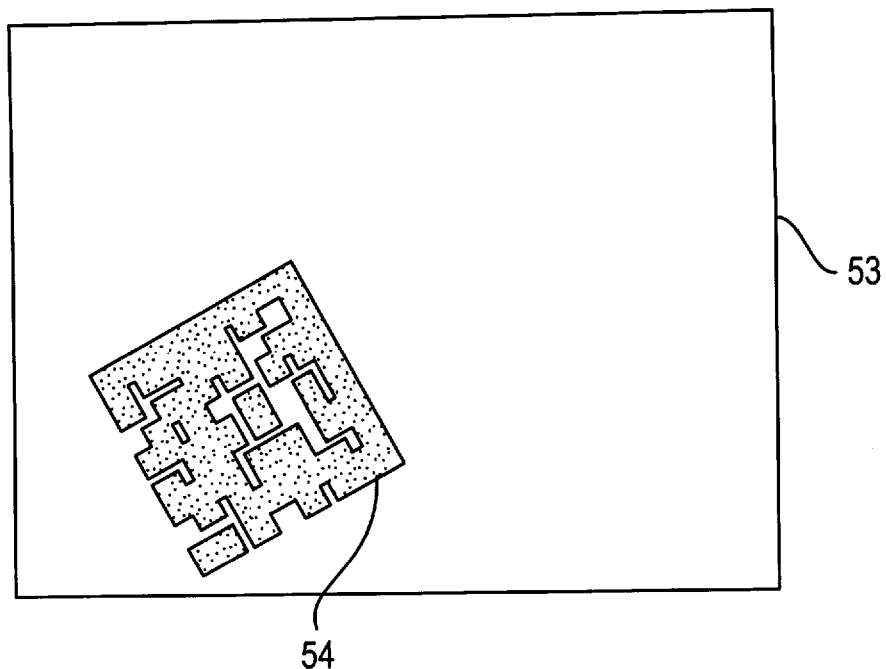
FIG. 3 is a schematic view of an example of an image read by a data symbol reader shown in FIG. 1.

The operation of the image inputting apparatus as constructed above will be discussed below, with reference to FIGS. 3 and 4.

The two-dimensional data symbol 54 is illuminated by light emitted from a light emitting diode (not shown). The light reflected from the data symbol 54 is converged by the condenser lens 13 onto the light receiving surface of the CCD 17. The signal charges gathered in the CCD 17 are read in accordance with the drive signal output from the CCD drive circuit 24 and are successively sent as image signals to the analog signal processing circuit 23. The image signals are converted to analog video signals by the analog signal processing circuit 23 and transmitted to the TV monitor 51 (see FIG. 1).

The image of the two-dimensional data symbol 54 is shown on the display 53 of the monitor 51. The display 53 of the monitor 51 corresponds to the entire area which can be read by the CCD 17. Therefore, if the two-dimensional data symbol 54 is within the readable area, the data symbol 54 is shown in it's entirety in the display 53 of the monitor, as illustrated in FIG. 3.

Figure 4:
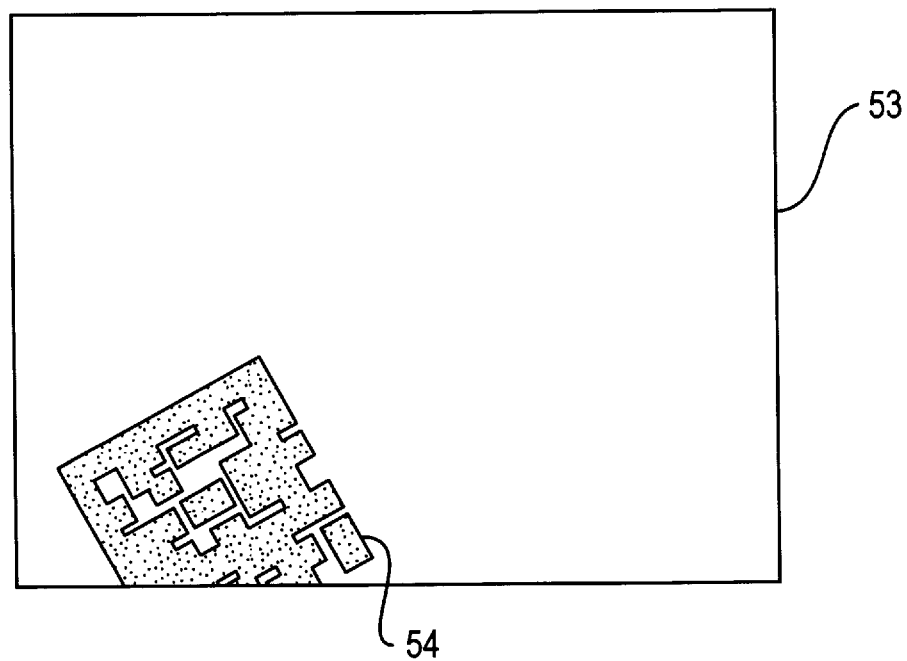
FIG. 4 is a schematic view of another example of an image read by a data symbol reader shown in FIG. 1.

Conversely, if the data symbol 54 is not completely within the readable area, as shown in FIG. 4, only a portion of the data symbol will appear in the display 53 of the monitor 54. Accordingly, the operator can ascertain the position of the data symbol relative to the body 10 while looking at the data symbol indicated in the display 53 to thereby determine whether the data symbol 54 is correctly located in a readable position.

If it is confirmed that the data symbol 54 is within the readable area of the CCD 17, the command signal to read the data symbol 54 is input to the CPU 34 when the operator manipulates the keyboard of the host computer 52, so that the two-dimensional data symbol 54 can be read. Namely, the numerical value or letter data, corresponding to the two-dimensional data symbol 54 is decoded by the CPU 34. The decoded data is sent to the host computer 52 through the communication driver 37.

The first and second substrates 21 and 31 are detachably attached to the body 10 of the apparatus, in the illustrated embodiment. In the absence of the second substrate 31, the image inputting apparatus can be applied to an analog camera, and if the first substrate 21 is connected to the output terminal 16, the image inputting apparatus can be applied to an analog/digital video camera for an industrial video apparatus which is adapted, for example, to monitor a production line of a factory. When the image inputting apparatus is applied to an analog/digital video camera, digital signals are provided by the first substrate 21 to the output terminal 16 by the A/D converter 25. In the absence of the second substrate 31, the operation of the CCD drive circuit 24 is controlled by a power switch (not shown).

If both the first and second substrates 21 and 31 are provided, the image inputting apparatus can be used as a two-dimensional data symbol reader. Although the A/D converter 25 is provided on the first substrate 21 in the illustrated embodiment, it is possible to provide the A/D converter 25 on the second substrate 31.

As will become apparent from the discussion below, if a third substrate 41 (see FIG. 6) is provided in place of the second substrate 31, an image inputting apparatus for a different use or purpose can be easily realized by a simpler and less expensive manufacturing process. Note that since the image signals are converted to digital signals by the A/D converter 25 of the first substrate 21 and are then supplied to the second substrate, only slight deterioration of the image quality occurs if the third substrate 41 is used instead of the second substrate 31.

In the illustrated embodiment, not only can the position of the body 10 relative to the two-dimensional data symbol 54 by quickly adjusted to move the data symbol 54 within the readable area while observing the two-dimensional data symbol 54 shown on the display 53 of the monitor, but also the time for reading the data can be substantially reduced. This includes the time necessary to perform a series of operations including moving the two-dimensional data symbol 54 to the readable area, reading and decoding the two-dimensional data symbol 54, and transmitting the decoded data to the host computer 52. Thus, the data symbol 54 can be easily, quickly, and correctly read by the simple data reader illustrated above. In particular, since the data symbol 54 can be viewed by an operator, the operator can accurately adjust the data reading position with little or no reading error. Furthermore, even if a reading error occurs, the error can be easily ascertained and corrected. Although the above-mentioned embodiment has been directed to a stationary type data inputting apparatus, the present invention is not limited to a stationary type, but can be applied, for example, to a contact type data inputting apparatus having a trigger switch, an image reading portion, and a light source on the body 10.

Moreover, it is possible to obtain a bit pattern of the two-dimensional data symbol 54 from the image data to transmit the bit pattern to the host computer 52 for decoding data.

Although the above-mentioned embodiment is illustrated as reading a two-dimensional data symbol 54, the invention can be applied to a one-dimensional data reader to read a data symbol such as a bar code.

Figure 5:
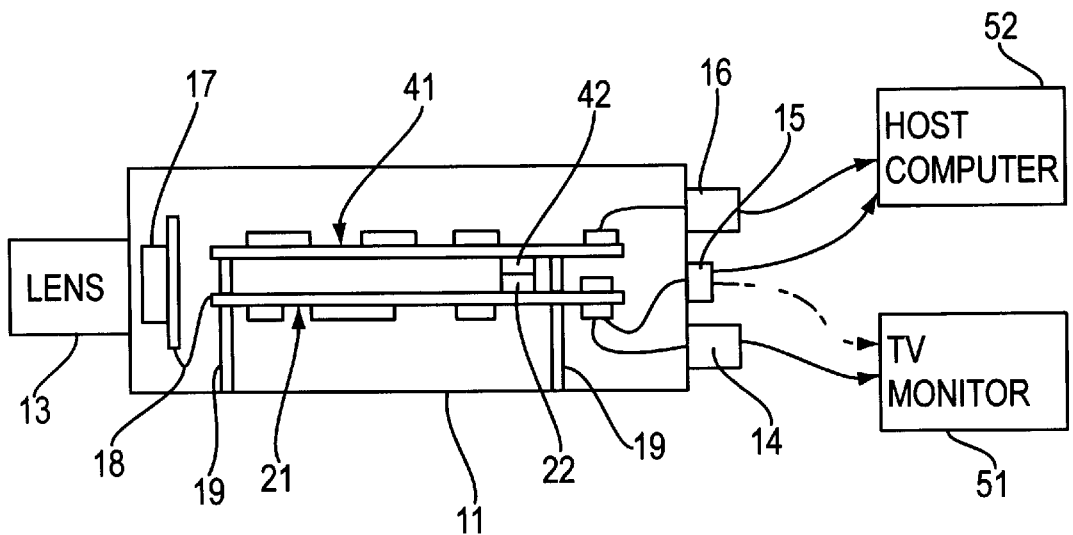
FIG. 5 is a schematic view of a digital image signal processor to which a data inputting apparatus according to the present invention is applied.
Figure 6:
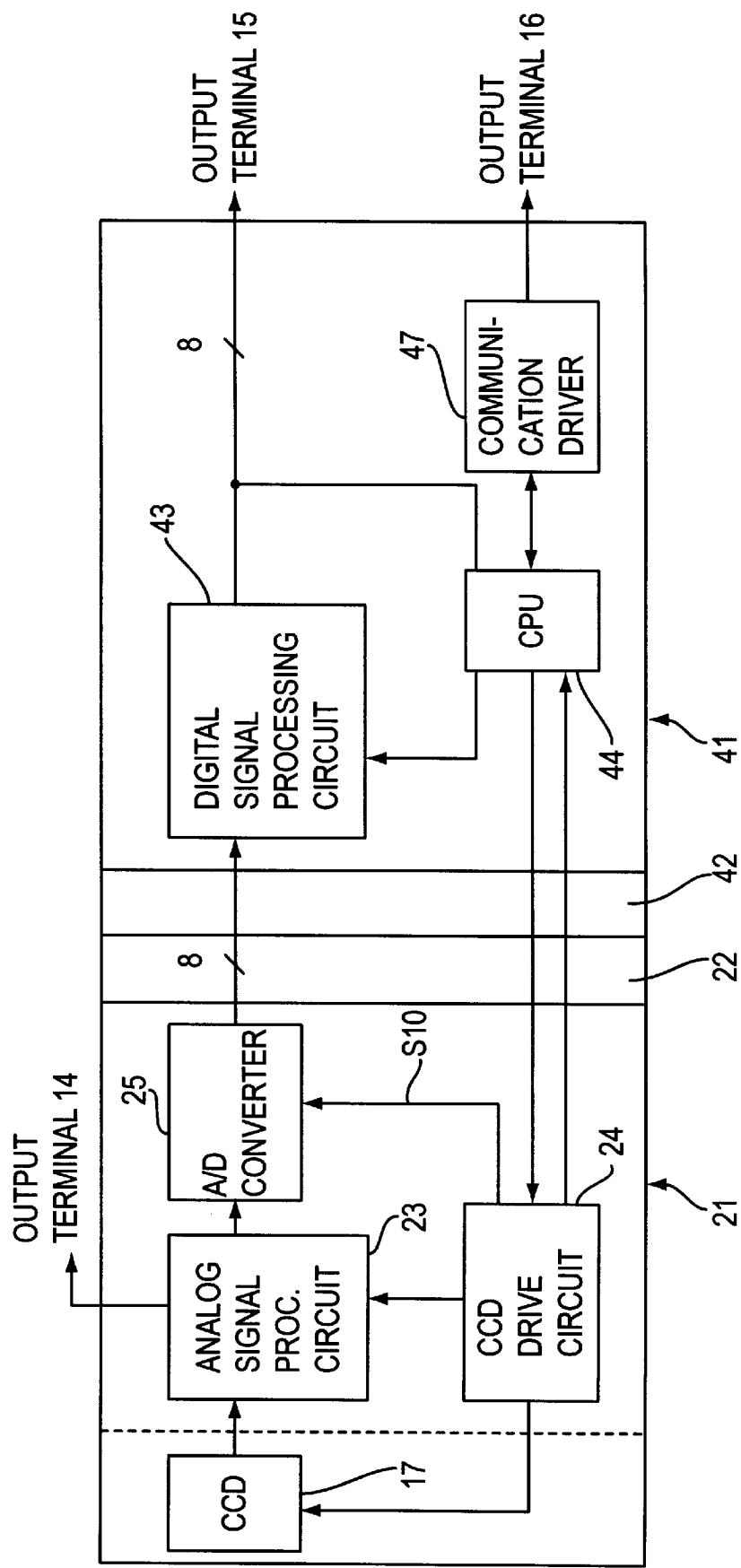
FIG. 6 is a block diagram of the digital image signal processor shown in FIG. 5.

FIGS. 5 and 6 show another embodiment of the present invention as applied to a stationary type digital image processor. In FIGS. 5 and 6, the components corresponding to those in the first embodiment are designated with the same reference numerals, and accordingly, no explanation thereof will be given hereinafter.

In the second embodiment, the second substrate (decoding substrate) 31 is substituted with a third substrate (image signal processing substrate) 41. The third substrate 41 is provided with a digital signal processing circuit 43, a CPU 44, a communication driver 47, and leads or conductors interconnecting these components.

The digital signal processing circuit 43 is connected to the A/D converter 25 in which the digital signals supplied from the A/D converter 25 are subject to, for example, a control emphasizing operation or a filtering operation such as a low pass filter to obtain appropriate digital video signals as an output. The CPU 44 generally controls the operation of the circuits in accordance with commands entered at the host computer's keyboard, similar to the first embodiment. The communication driver 47 is connected to the output terminal 16 and the CPU 44.

In order to substitute the second substrate 31 with the third substrate 41, the connectors 22 and 32 are disconnected, and thereafter, the second substrate 31 and the first substrate 21 are detached from the supporting plates 19. Thereafter, the first substrate 21 and the third substrate 41 are attached to the supporting plate 19. The connector 42 of the third substrate 41 is connected to the connector 22 of the first substrate 21, so that the CCD driving circuit 24, the CPU 44, the A/D converter 25, and the digital signal processing circuit 43 are electrically interconnected.

In the second embodiment, the image received by the CCD 17 is indicated on the display of the TV monitor 51 and converted to digital signals to be supplied to the digital signal processor 43 to obtain digital video signals to be supplied to the host computer 52 through the output terminal 15. The digital video signals are stored in the memory of the host computer 52 and are supplied through the communication driver 47.

An operator performs image processing such as enlargement or rotation of the image within the host computer 52 while looking at the image shown on the display 53.

From the above discussion, a digital signal processing apparatus can be realized by simply substituting the second substrate (decoding substrate) 31 in the first embodiment with the third substrate (image signal processing substrate) 41. Accordingly, the manufacturing process can be simplified with results in reduced production costs for realizing a mass-produced image inputting apparatus.

Since the image received by the CCD 17 is entirely indicated on the display 53, the operator can confirm with certainty that the image to be read is within the readable area. Therefore, accurate positioning of the image reader relative to the object can be efficiently carried out, and received image can be easily and correctly read by the image inputting apparatus.

As can be understood from the foregoing, the manufacturing process of the image inputting apparatus such as a data symbol reading apparatus is simplified resulting in a reduced production cost.

I claim:

1. An image processing apparatus having a plurality of detachably attached circuit board substrates having distinct data processing functions, comprising:

a first circuit board substrate, said first circuit board substrate having an image pick-up device, a video circuit, and a first connector mounted thereon;

a second circuit board substrate, said second circuit board substrate being selected from a plurality of different image data processing circuit board substrates connectible to said first circuit board substrate, and having a processor and a second connector mounted thereon, wherein an operating state of said image processing apparatus is determined in accordance with an attachment of said first circuit board substrate to said second circuit board substrate by electrically connecting said first connector and said second connector; and a body, said first circuit board substrate and said second circuit board substrate being mounted together within said body of said image processing apparatus, so that said apparatus has different operating states depending on the selection from the plurality of different image data processing circuit board substrates and on said attachment of said first and second circuit board substrates within said body.

2. The image processing apparatus according to claim 1, said first circuit board substrate further comprising an image pick-up driving circuit and a first interface, wherein said video circuit outputs video signals to a first external device connected to said first interface, and wherein said image pick-up driving circuit communicates to said processor.

3. The image processing apparatus according to claim 2, wherein said first external device comprises a display monitor.

4. The image processing apparatus according to claim 2, said first circuit board substrate further comprising an analog-to-digital converter, said analog-to-digital converter outputting digital image data to said second circuit board substrate.

5. The image processing apparatus of claim 4, said video circuit comprising an analog signal processing circuit, and said image pick-up device comprises a charge-coupled device.

6. The image processing apparatus of claim 4, said second circuit board substrate further comprising a comparator, a serial/parallel converter, and a memory.

7. The image processing apparatus of claim 6, wherein said comparator compares an output of said analog-to-digital converter with a predetermined threshold level, and in accordance with said comparison, outputs 1-bit data representative of black and white image data.

8. The image processing apparatus of claim 7, said second circuit board substrate further comprising a communication driver, said communication driver outputting decoded data to a second external device.

9. The image processing apparatus of claim 8, wherein said second external device comprises a host computer.

10. The image processing apparatus of claim 4, said second circuit board substrate further comprising a digital signal processor, said digital signal processor outputting data to a second external device.

11. The image processing apparatus of claim 10, wherein said first external device comprises a display monitor and said second external device comprises a host computer.

12. The image processing apparatus of claim 10, wherein said second circuit board substrate further comprises a communication driver, said communication driver outputting decoded data to second external device.

13. An image processing apparatus having a plurality of detachably attached circuit board substrates having distinct data processing functions, comprising:
    an image pick-up device;
    a first circuit board substrate, said first circuit board substrate having an analog signal processing circuit, and a first connector mounted thereon;
    a second circuit board substrate, said second circuit board substrate being selected from a plurality of possible image decoding circuit board substrates connectible to said first circuit board substrate, and having a central processor unit and a second connector mounted thereon,
    wherein a two-dimensional encoded symbol is read by said image pick-up device, an operating state of said image processing apparatus is determined in accordance with an attachment of said first circuit board substrate to said second circuit board substrate by electrically connecting said first connector and said second connector; and
    a body, said first circuit board substrate and said second circuit board substrate being mounted together within said body of said image processing apparatus, so that said apparatus has different operating states depending on the selection from the plurality of possible image decoding circuit board substrates and on said attachment of said first and second circuit board substrates within said body.

14. The image processing apparatus according to claim 13, said first circuit board substrate further comprising an image pick-up driving circuit and a first interface, wherein said analog signal processing circuit outputs video signals to a display monitor connected to said first interface, and wherein said image pick-up driving circuit communicates to said central processor unit.

15. The image processing apparatus according to claim 14, said first circuit board substrate further comprising an analog-to-digital converter, said analog-to-digital converter outputting digital image data to said second circuit board substrate.

16. The image processing apparatus of claim 15, said second circuit board substrate further comprising a comparator, a serial/parallel converter, and a memory,
    wherein said comparator compares an output of said analog-to-digital converter with a predetermined threshold level, and in accordance with said comparison, outputs 1-bit data representative of black and white image data.

17. The image processing apparatus of claim 16, said second circuit board substrate further comprising a communication driver, said communication driver outputting decoded data to a host computer.

18. The image processing apparatus of claim 15, said second circuit board substrate further comprising a digital signal processor, said digital signal processor outputting data to a host computer.

19. The image processing apparatus of claim 18, wherein said second circuit board substrate further comprises a communication driver, said communication driver outputting decoded data to said host computer.

20. An image processing apparatus having a plurality of detachably attached substrates having distinct data processing functions, comprising:
    a first substrate, said first substrate comprising an image pick-up device, an image pick-up driving circuit, a first interface, a first connector, an analog-to-digital converter, and a video circuit, said video circuit outputting video signals to a first external device connected to said first interface;
    a second substrate, said second substrate being selected from a plurality of image decoding second substrates and comprising a second connector, a comparator, a serial/parallel converter, a memory, and a processor, said image pick-up driving circuit communicating with said processor and said analog-to-digital converter outputting digital image data to said second substrate;
    wherein an operating state of said image processing apparatus is determined in accordance with an attachment of said first substrate to said second substrate by electrically connecting said first connector and said second connector, and wherein said first substrate and said second substrate are disposed within a body of said image processing apparatus.

21. The image processing apparatus of claim 20, wherein said comparator compares an output of said analog-to-digital converter with a predetermined threshold level, and in accordance with said comparison, outputs 1-bit data representative of black and white image data.

22. The image processing apparatus of claim 21, said second substrate further comprising a communication driver, said communication driver outputting decoded data to a second external device.

23. The image processing apparatus of claim 22, wherein said second external device comprises a host computer.

24. The image processing apparatus of claim 21, said second substrate further comprising a digital signal processor, said digital signal processor outputting data to a second external device.

25. An image processing apparatus having a plurality of detachably attached substrates having distinct data processing functions, comprising:

an image pick-up device;

a first substrate, said first substrate comprising an analog-to-digital converter, an analog signal processing circuit, a first interface, a first connector, and an image pick-up driving circuit, said analog signal processing circuit outputting video signals to a display monitor connected to said first interface; and a second substrate, said second substrate being selected from a plurality of image decoding second substrates and comprising a central processor unit, a second connector, a comparator, a serial/parallel converter, and a memory, said comparator comparing an output of said analog-to-digital converter with a predetermined threshold level and outputting 1-bit data representative of black and white image data in accordance with said comparison, said image pick-up driving circuit communicating to said central processor unit, and said analog-to-digital converter outputting digital image data to said second substrate;

wherein a two-dimensional encoded symbol is read by said image pick-up device, an operating state of said image processing device is determined in accordance with an attachment of said first substrate to said second substrate by electrically connecting said first connector and said second connector, and said first substrate and said second substrate are disposed within a body of said image processing apparatus.

26. The image processing apparatus of claim 25, said second substrate further comprising a communication driver, said communication driver outputting decoded data to a host computer.

27. The image processing apparatus of claim 25, said second substrate further comprising a digital signal processor, said digital signal processor outputting data to a second external device.

28. An image processing apparatus system including an image processing apparatus, said system comprising:

a plurality of circuit board substrates including video signal generating circuit board substrates for outputting a video signal, digital camera circuit board substrates for processing said video signal into a digital video signal, and data symbol reader circuit board substrates for processing said video signal to decode data symbol information therein;

said image processing apparatus including an individual casing for housing said video signal generating circuit board substrate and at least one of said digital camera circuit board substrates and said data symbol reader circuit board substrates;

wherein when said video signal generating circuit board substrate is connected to said digital camera circuit board substrate within said individual casing, said image processing apparatus outputs digital video signals as a digital video camera, and when said video signal generating circuit board substrate is connected to said data symbol reader circuit board substrates within said individual casing, said image processing apparatus reads digital data symbols as a data symbol reader.

29. An image processing apparatus system including an image processing apparatus, said system comprising:

a plurality of circuit board substrates including video signal generating circuit board substrates for outputting a video signal, digital camera circuit board substrates for processing said video signal into a digital video signal, and data symbol reader circuit board substrates for processing said video signal to decode data symbol information therein, said image processing apparatus including an individual casing for housing said video signal generating circuit board substrate and at least one of said digital camera circuit board substrates and said data symbol reader circuit board substrates, each of said plurality of circuit board substrates including electrical connectors in matching predetermined positions and mountings for mounting to said individual casing, and wherein when said video signal generating circuit board substrate is matched and electrically connected to said digital camera circuit board substrate by said electrical connectors and mounted to said individual casing by said mountings, said image processing apparatus outputs digital video signals as a video camera, and when said video signal generating circuit board substrate is matched and electrically connected to said data symbol reader circuit board substrate by said electrical connectors and mounted to said individual casing by said mountings, said image processing apparatus reads digital data symbols as a data symbol reader.

30. An image processing apparatus comprising:

an image pick-up device for producing an analog image signal;

a first circuit board substrate having an analog signal processing circuit for processing said analog image signal into an analog video signal, a first connector for outputting said analog video signal, and an A/D convertor for converting said analog video signal to digital image data; and a second circuit board substrate detachable from said first circuit board substrate, having a binary coding device for outputting binary data representative of black and white image data generated by comparing said digital image data to a predetermined threshold level when said second circuit board substrate is attached to said first circuit board substrate.

31. The image processing apparatus according to claim 30, further comprising:

an alternate second circuit board substrate detachable from said first circuit board substrate, having a digital signal processor for processing said digital image data to a digital video signal when said alternate second circuit board substrate is attached to said first circuit board substrate.

* * * * *